United States Patent
Mirgorodski et al.

(10) Patent No.: US 7,651,913 B2
(45) Date of Patent: Jan. 26, 2010

(54) METHOD OF FORMING NON-VOLATILE MEMORY (NVM) RETENTION IMPROVEMENT UTILIZING PROTECTIVE ELECTRICAL SHIELD

(75) Inventors: Yuri Mirgorodski, Sunnyvale, CA (US); Peter J. Hopper, San Jose, CA (US); Vladislav Vashchenko, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/012,545

(22) Filed: Feb. 4, 2008

(65) Prior Publication Data

US 2008/0213959 A1 Sep. 4, 2008

Related U.S. Application Data

(62) Division of application No. 11/044,511, filed on Jan. 27, 2005, now Pat. No. 7,375,393.

(51) Int. Cl.
*H01L 21/336* (2006.01)
(52) U.S. Cl. .......... 438/257; 257/E21.18; 257/E21.209; 438/201
(58) Field of Classification Search ................ 438/201, 438/258; 257/E21.18, E21.209
See application file for complete search history.

(56) References Cited

U.S. PATENT DOCUMENTS

| 4,698,787 | A |   | 10/1987 | Mukherjee et al. ........... 365/185 |
| 4,988,635 | A |   | 1/1991  | Ajika et al. .................... 437/43 |
| 5,021,848 | A |   | 6/1991  | Chiu .......................... 357/23.5 |
| 5,291,046 | A |   | 3/1994  | Kumakura ................... 257/316 |
| 5,440,510 | A |   | 8/1995  | Caprara et al. ............... 365/185 |
| 5,457,336 | A | * | 10/1995 | Fang et al. ................... 257/322 |
| 5,550,073 | A |   | 8/1996  | Hong .......................... 437/43 |
| 5,614,429 | A | * | 3/1997  | Shin et al. .................... 438/267 |
| 5,898,606 | A |   | 4/1999  | Kobayashi et al. ............ 365/63 |
| 6,137,723 | A |   | 10/2000 | Bergemont et al. ..... 365/185.18 |
| 7,057,232 | B2 |  | 6/2006  | Ausserlechner ............. 257/316 |
| 2004/0041203 | A1 | | 3/2004 | Kim ........................... 257/316 |

* cited by examiner

*Primary Examiner*—Jerome Jackson, Jr.
*Assistant Examiner*—Paul A Budd
(74) *Attorney, Agent, or Firm*—Dergosits & Noah LLP

(57) ABSTRACT

An electrical shield is provided in a non-volatile memory (NVM) cell structure to protect the cell's floating gate from any influence resulting from charge redistribution in the vicinity of the floating gate during a programming operation. The shield may be created from the second polysilicon layer or other conductive material covering the floating gate. The shield may be grounded. Alternately, it may be connected to the cell's control gate electrode resulting in better coupling between the floating gate and the control gate. It is not necessary that the shield cover the floating gate completely, the necessary protective effect is achieved if the coupling to the dielectric layers surrounding the floating gate is reduced.

3 Claims, 4 Drawing Sheets

METHOD OF FORMING NON-VOLATILE MEMORY (NVM) RETENTION IMPROVEMENT UTILIZING PROTECTIVE ELECTRICAL SHIELD

RELATED APPLICATION

This application is a divisional of U.S. application Ser. No. 11/044,511, filed Jan. 27, 2005, now U.S. Pat. No. 7,375,393, issued May 20, 2008, which is hereby incorporated by reference herein in its entirety.

TECHNICAL FIELD

The present invention relates to a methodology for improving the retention properties of a non-volatile memory (NVM) cell by utilizing an electrical shield to protect against charge redistribution in the layers surrounding the cell's floating gate.

DESCRIPTION OF THE INVENTION

Figure 1:
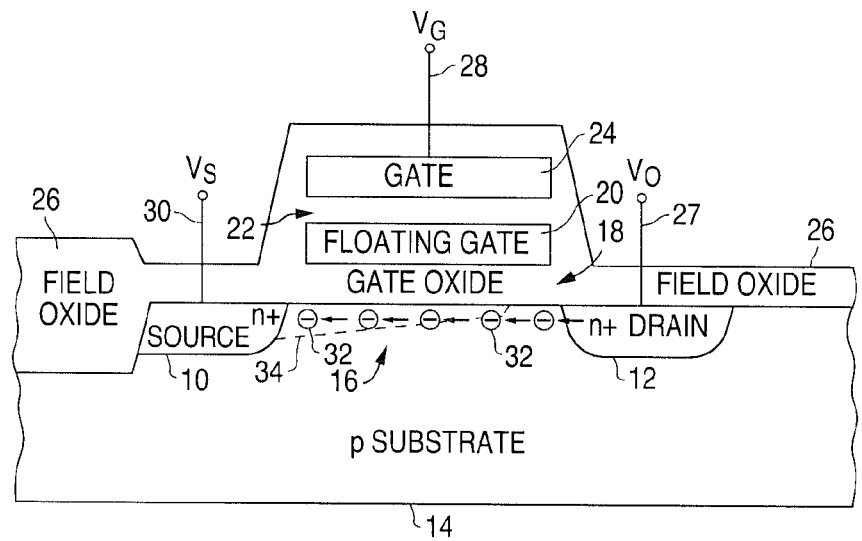
FIG. 1 is a partial cross section drawing illustrating a conventional electrically programmable read only memory (EPROM) cell structure.

U.S. Pat. No. 4,698,787, issued on Oct. 6, 1987, discloses as prior art the conventional electrically programmable read only memory (EPROM) device structure shown in FIG. 1. The FIG. 1 EPROM transistor device includes a source 10 and drain 12 formed in a substrate 14. The source 10 and the drain 12 define a channel 16 in the substrate 14. Positioned above the channel 16 is a layer of insulating material that forms a gate dielectric layer 18. A floating gate 20 of semiconductor material is formed over the gate dielectric layer 18. A second layer 22 of insulating material is formed over the floating gate 20. Finally, a layer of semiconductor material is formed over the second layer of insulating material 22 to form a control gate 24. Field oxide 26 isolates the transistor structure from periphery devices. Electrical connections 27, 28 and 30 are provided for applying voltages to the drain 12, control gate 24, and source 10, respectively.

Programming of the FIG. 1 EPROM cell is accomplished by raising the potential of the drain 12 (e.g., 8-12V), holding the source 10 at ground and applying a programming pulse (e.g., approximately 13-21V) to the control gate 24 for a preselected period of time (e.g., 1-10milliseconds). The result of these conditions is that a conductive region is established in the channel 16 across which electrons 32 are accelerated. The conductive region is designated by the dashed line 34 in FIG. 1. The magnitude and polarity of the voltages applied to the drain 12, the source 10 and the control gate 24 are such that this conductive region is "pinched off" in the region adjacent to the drain 12. This causes electrons 32 to be raised sufficiently in potential so that they become "hot." These "hot" electrons create additional electron/hole pairs by impact ionization. In this condition, these electrons are elevated to an energy level that permits them to overcome the insulating properties of the gate dielectric 18. The hot electrons can thus "jump" the potential barrier of the gate dielectric 18. Due to the electric field created by the control gate 24, the hot electrons are attracted to the floating gate 20 where they are stored, thereby programming the cell.

Figure 2:
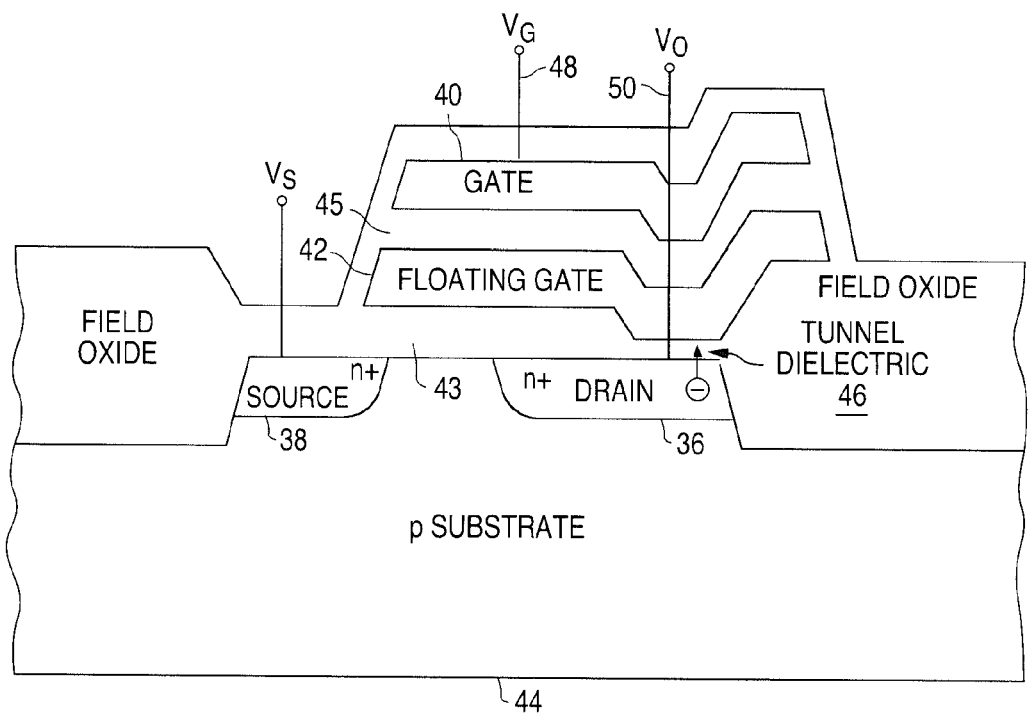
FIG. 2 is a partial cross section drawing illustrating a conventional electrically erasable programmable read only memory (EEPROM) cell structure.

The above-cited '787 patent also discloses a programming mechanism for an electrically erasable programmable read only memory (FEPROM), shown in FIG. 2. The EEPROM cell structure shown in FIG. 2 utilizes a different programming mechanism than does the EPROM cell described above. As with the EPROM structure, the EEPROM structure includes a drain 36, a source 38, a floating gate 42 separated from the substrate by a gate oxide layer 43, a gate 40 separated from the floating gate 42 by another layer of oxide 45, all of which are deposited or thermally grown. However, the EEPROM structure differs from the EPRO structure in that it provides a thin tunnel dielectric 46 between the drain 36 and the floating gate 42. As shown in FIG. 2, the portion of the floating gate 42 that is positioned above the tunnel dielectric 46 is positioned on the drain region 36. Further, the portion of the gate 40 that is aligned with the tunnel dielectric 46 is also positioned on the drain 36. Programming (and erasing) of this structure is achieved by inducing potential differences between the gate 40 and drain 36 that are on the order of 20V. The thin dielectric region coupled with the high voltage between the gate 40 and the drain 36 induces "Fowler-Nordheim tunneling."

To program the FIG. 2 cell, i.e. to place electrons on the floating gate 42, the drain 36 is held at ground potential while the gate 40 is pulsed for approximately 10 milliseconds at a potential of approximately 20V. During this programming operation, the source 38 is allowed to float. Under these conditions, electrons tunnel through the tunnel dielectric 46 to the floating gate 42.

Figure 3A:
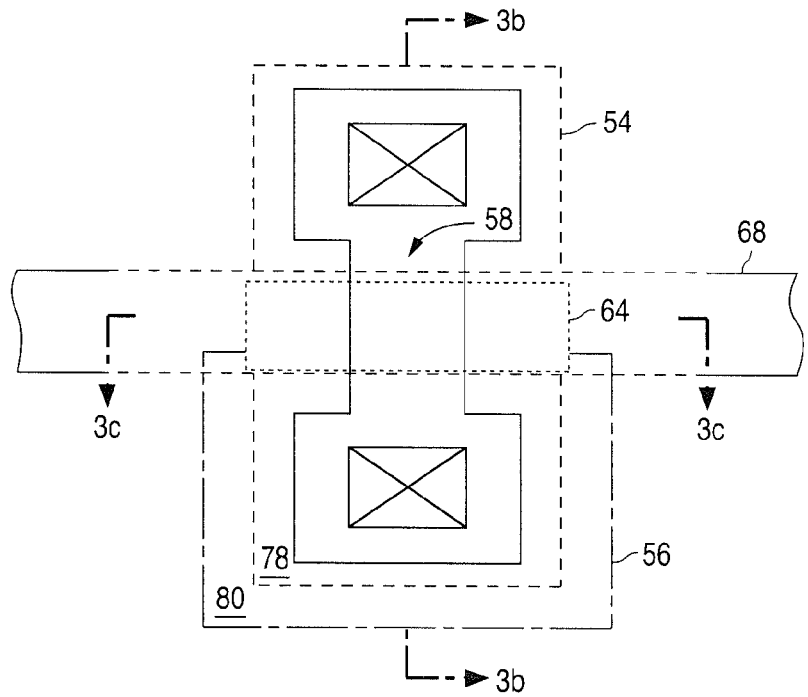
FIGS. 3a and 3b are, respectively, a plan view and a partial cross section drawing illustrating an alternate embodiment of a conventional EEPROM cell.
Figure 3B:
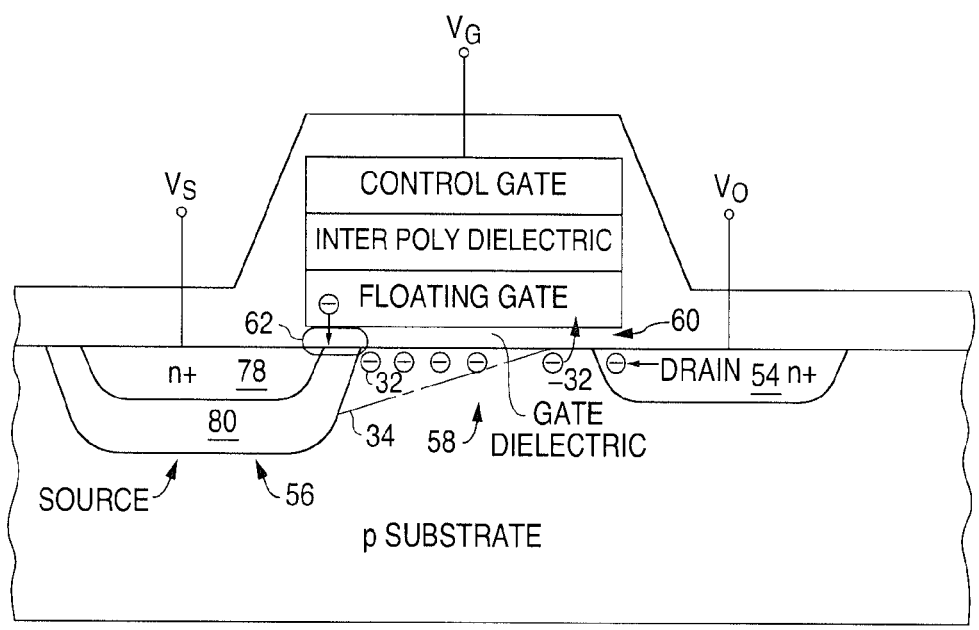

The '787 patent also discloses another EEPROM cell structure, shown in FIGS. 3a and 3b. In this structure, a relatively shallow drain 54 and a deeper source 56 are formed in a silicon substrate 52. A channel 58 is defined between the source 56 and the drain 54. A gate dielectric 60 is formed over the channel 58 and extends over the channel 58 and to extend between the drain 54 and to overlap a portion of the source 56. The gate dielectric 60 has a relatively uniform thickness over its entire cross section. A floating gate 64 is formed over the gate dielectric 60. A second layer of dielectric material 66 is formed over the floating gate 64. A control gate 68 is formed over the second layer dielectric material 66.

Programming the cell shown in FIGS. 3a and 3b is achieved by raising the drain 54 and the control gate 68 to predetermined potentials above that of the source 56. For example, in one programming scheme, the drain 54 is raised to between 4-6V, while the control gate 68 is pulsed at about 10-12V for approximately 0.5-5 msec. Under these conditions, "hot" electrons are generated and accelerated across the gate dielectric 60 and onto the floating gate 64. Thus, the programming operation for this cell is similar to that of a conventional EPROM cell.

U.S. Pat. No. 6,137,723, issued on Oct. 24, 2000, discloses a so-called "Frohmann-Bentchkowsky "memory transistor, shown in FIG. 4. The FIG. 4 device includes spaced-apart p-type source 70 and drain 72 formed in an n-well 74, which in turn is formed in a p-type silicon substrate. A channel is defined between the source 70 and the drain 72 and a layer of gate oxide 80 is formed over the channel 78. A gate 82 is formed over the gate oxide layer 80. A layer of dielectric material 84 along with gate oxide 80 encapsulates the gate 82.

Figure 4:
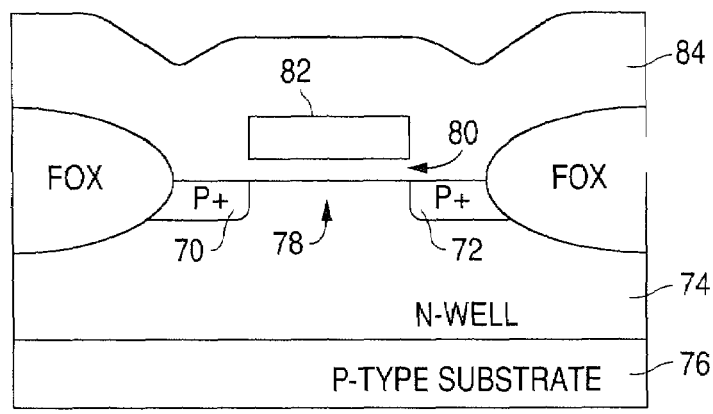
FIG. 4 is a partial cross sectioning drawing illustrating a conventional Frohmann-Bentchkowsky EPROM cell.

The FIG. 4 cell is programmed by applying biasing voltages to the n-well and to the drain 72 that are sufficient to induce avalanche breakdown. For example, avalanche breakdown is induced by applying ground to the n-well 74 and a negative breakdown voltage to drain 72, while either grounding or floating the source 70, while floating or applying the positive breakdown voltage to the source 70. The biasing voltages that are sufficient to induce avalanche breakdown establish a strong electric field across the drain-to-well junction depletion region. The strong electric field accelerates electrons in the junction depletion region into substrate hot electrons. A number of these substrate hot electrons penetrate the gate oxide layer 80 and accumulate on the gate 82, thereby programming the cell.

Figure 5:
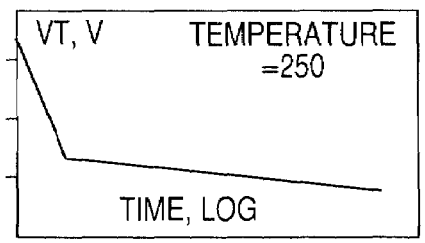
FIG. 5 is a plot presenting typical dependence of VT vs. time for a programmed non-volatile memory (NVM) cell.

Each of the cells described above is exemplary of a programming scheme for a non-volatile memory (NVM) cell. One of the basic properties of NVM cells is the ability to maintain charge on the floating gate within a required period of time (retention). The method to control retention is to monitor the threshold voltage VT of the cell over time. A typical dependence of VT versus time is presented in FIG. 5. The FIG. 5 plot shows two mechanisms in effect with different characteristics that are commonly attributed to two leakage mechanisms: an initial leakage mechanism that leads to a significant VT shift within a short time (seconds or minutes) followed by a more gradual decrease in VT over a much longer period of time (e.g. 10 years).

Figure 6:
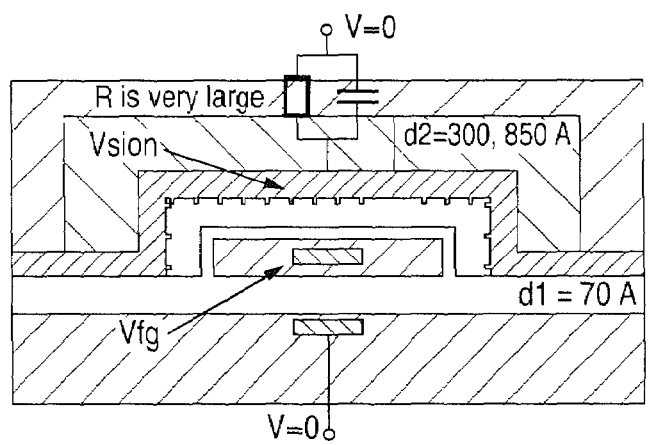
FIG. 6 is a partial cross-section drawing illustrating a NVM cell and corresponding electrical model, in accordance with the concepts of the present invention.

The present invention is based upon the concept that the initial radical VT shift is not related to leakage from the floating gate, as is commonly believed, but rather may be attributed to charge redistribution in the dielectric layers/interfaces that surround the floating gate that effect the floating gate voltage due to capacitive coupling, as shown in FIG. 6. That is, after programming, the floating gate has a negative voltage that results in an electric field directed to the floating gate. This electric field forces positive charges to move toward the floating gate where they can be trapped at some of the interfaces. This process stops when the amount of trapped charge is sufficient to reduce the electric field outside the interface to zero.

In FIG. 6, the polysilicon floating gate electrode is formed on gate oxide, which, in turn, is formed on the composite. Additional gate oxide and plasma enhanced TEOS (PETEOS) insulates the floating gate, as does sacrificial SION and PETEOS.

This, a new control gate design is proposed that utilizes a protective shield. The shield can be made from the commonly employed second polysilicon layer or from other conductive material deposited over the floating gate. The second poly shield is similar to the well-known stacked gate design, but has a new function—to prevent the floating gate from being influenced by surrounding charges resulting from a programming operation. In the new design, the coupling between the control gate and the floating gate has low components due to the capacitance to the well and to the shield.

Figure 7:
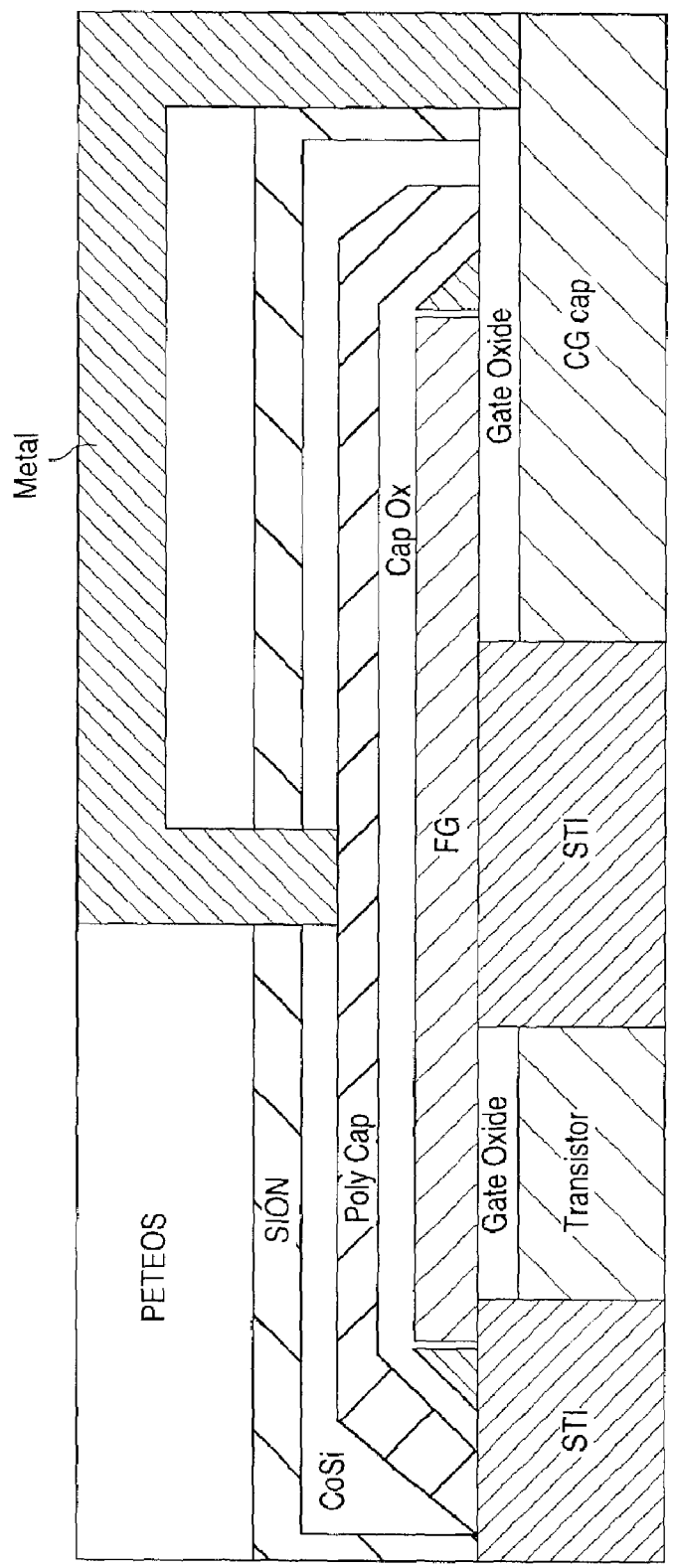
FIG. 7 is a partial cross section drawing illustrating an embodiment of an NVM cell utilizing an electrical shield for the cell's floating gate in accordance with the concepts of the present invention.

FIG. 7 shows a cross section of the new shielded NVM cell. The transistor (Transistor) is formed in the substrate in an active region defined by shallow trench isolation (STI). Gate oxide (Gate Oxide) separates the polysilicon floating gate (FG) from the substrate. In the FIG. 7 embodiment, a control gate diffusion region (CG Cap) is formed in the substrate and is overlapped by the floating gate (FG), with intervening gate oxide (Gate Oxide) therebetween. A protective polysilicon cap (Poly Cap) is formed over the floating gate (FG) with intervening cap oxide (Cap Ox) therebetween. A layer of cobalt silicide (CoSi) is formed on the polysilicon cap (Poly Cap) and a layer of silicon oxinitride (SION) is formed on the CoSi layer. As stated above, the poly cap (Poly Cap) may be grounded. The FIG. 7 embodiment shows the poly cap (Poly Cap) electrically connected to the substrate control gate via a metal interconnect structure (Metal). Isolation is provided by an overlapping layer of PETEOS.

What is claimed is:

1. A method of forming a non-volatile memory (NVM) structure in a semiconductor substrate having a first conductivity type, the method comprising:

forming spaced apart drain and source regions in the semiconductor substrate, the drain and source regions having a second conductivity type opposite the first conductivity type and defining a substrate channel region therebetween;

forming a layer of gate dielectric material over the substrate channel region;

forming a polysilicon floating gate having a first portion formed on the gate dielectric material and over the substrate channel region;

forming a control gate diffusion region in the semiconductor substrate and overlapped by a second portion of the polysilicon floating gate with silicon oxide formed between the control gate diffusion region and the second portion of the polysilicon floating gate;

forming a conductive protective shield over the floating gate electrode and separated therefrom by intervening dielectric material; and forming a conductive interconnect element to electrically connect the conductive protective shield and the control gate diffusion region.

2. The method of claim 1, and further comprising:
   forming a metal silicide layer on the conductive protective shield.

3. The method of claim 2, and further comprising:
   forming a silicon oxinitride layer on the metal silicide layer.

* * * * *